United States Patent
Schwab et al.

(10) Patent No.: US 9,806,297 B2
(45) Date of Patent: Oct. 31, 2017

(54) MASKING FOR LIGHT EMITTING DEVICE PATTERNS

(71) Applicant: KONINKLIJKE PHILIPS N.V., Eindhoven (NL)

(72) Inventors: Holger Schwab, Aachen (DE); Reinhold Antonius Fleige, Herzogenrath (DE)

(73) Assignee: Koninklijke Philips N.V., Eindhoven (NL)

( * ) Notice: Subject to any disclaimer, the term of this patent is extended or adjusted under 35 U.S.C. 154(b) by 238 days.

(21) Appl. No.: 14/353,963

(22) PCT Filed: Oct. 12, 2012

(86) PCT No.: PCT/IB2012/055532
§ 371 (c)(1),
(2) Date: Apr. 24, 2014

(87) PCT Pub. No.: WO2013/061197
PCT Pub. Date: May 2, 2013

(65) Prior Publication Data
US 2014/0306208 A1    Oct. 16, 2014

Related U.S. Application Data

(60) Provisional application No. 61/661,445, filed on Jun. 19, 2012, provisional application No. 61/551,471, filed on Oct. 26, 2011.

(51) Int. Cl.
*H01L 51/56*  (2006.01)
*H01L 51/52*  (2006.01)
*H01L 27/32*  (2006.01)

(52) U.S. Cl.
CPC .......... *H01L 51/56* (2013.01); *H01L 27/3209* (2013.01); *H01L 51/5209* (2013.01);
(Continued)

(58) Field of Classification Search
CPC ............. H01L 51/5209; H01L 51/5225; H01L 27/3209; H01L 51/56; H01L 51/5278; H01L 27/3244
(Continued)

(56) References Cited

U.S. PATENT DOCUMENTS 5,757,139 A * 5/1998 Forrest ................... G09G 3/14
                                                           313/504
7,714,504 B2    5/2010 Forrest et al.
(Continued)

FOREIGN PATENT DOCUMENTS

JP    2011034901 A    2/2011
WO   2005104072 A1   11/2005
(Continued)

OTHER PUBLICATIONS

Tang et al "Organic Electroluminescent Diodes" Appl. Phys. Lettt. vol. 51, pp. 913-915 (1987).

*Primary Examiner* — David Vu
*Assistant Examiner* — Mouloucoulaye Inoussa

(57) ABSTRACT

The present invention relates to a light emitting device with at least two active areas and a more robust method of manufacturing such a device, wherein a first electrode layer (20) is deposited through a mask overcoating an active material (10). A second active material (30) is deposited through another mask in such a way that an area which covers and extends beyond the first electrode layer (20) is overcoated with the organic material. Then, a second electrode layer (40) is coated through a mask such that it overcoats the whole second active material (30).

8 Claims, 5 Drawing Sheets

(52) U.S. Cl.
CPC ...... *H01L 51/5225* (2013.01); *H01L 51/5278* (2013.01); *H01L 2933/0016* (2013.01)

(58) Field of Classification Search
USPC .................. 257/48, 40, 72, 88; 438/29, 46; 313/506, 500, 504, 505, 509
See application file for complete search history.

(56) References Cited

U.S. PATENT DOCUMENTS

| | | | |
|---|---|---|---|
| 8,053,770 | B2 | 11/2011 | D'Andrade et al. |
| 2003/0218173 | A1 | 11/2003 | Nishi et al. |
| 2006/0255725 | A1* | 11/2006 | Kim .................. H01L 27/3209 313/506 |
| 2008/0203903 | A1 | 8/2008 | De Kok et al. |
| 2013/0001595 | A1* | 1/2013 | Schwab ............. H01L 27/3239 257/79 |

FOREIGN PATENT DOCUMENTS

| | | |
|---|---|---|
| WO | 2010016446 A1 | 2/2010 |
| WO | 2010022102 A3 | 2/2010 |
| WO | 2011117814 A1 | 9/2011 |

* cited by examiner

MASKING FOR LIGHT EMITTING DEVICE PATTERNS

FIELD OF THE INVENTION

The invention relates to an organic light emitting diode (OLED) device and a method of manufacturing such a device.

BACKGROUND OF THE INVENTION

OLED's are effectively light emitting diodes made from semiconducting organic materials. They are currently still under development and have potential application in numerous fields. First ultra-thin and low-voltage OLEDs have been described in C. W. Tang and S. A. VanSlyke, "Organic electroluminescent diodes" Appl. Phys. Lett., Vol. 51, pp. 913-915 (1987). Since then, much development has been made to improve these devices for applications in flat panel displays as well as in solid state lighting.

A typical OLED is composed of a layer of organic materials situated between two electrodes, the anode and cathode, all deposited on a substrate. During operation, a voltage is applied across the OLED such that the anode is positive with respect to the cathode. A current of electrons flows through the device from cathode to anode, as electrons are injected into the LUMO of the organic layer at the cathode and withdrawn from the HOMO at the anode. This latter process may also be described as the injection of electron holes into the HOMO. Electrostatic forces bring the electrons and the holes towards each other and they recombine forming an exciton, a bound state of the electron and hole. This happens closer to the emissive layer, because in organic semiconductors holes may be more mobile than electrons. The decay of this excited state results in a relaxation of the energy levels of the electron, accompanied by emission of radiation whose frequency is in the visible region.

Research on how to improve the device emission efficiency continues to be a major focus. In general, improved efficiency can be achieved through the use of highly efficient luminescent materials and in designing novel device structures. Higher current efficiency can be achieved by multiphoton devices consisting of stacked units of OLEDs. The current efficiency can be multiplied because of electron and hole recycling.

If OLED's with individually addressable areas are manufactured, this is done by a process in which the organic OLED material and the cathode material of each segment is deposited with individual masks in such a way, that only the areas that are supposed to emit light are coated with these materials. This leads to the situation that the masks to coat the second emissive layer area is overlapping or touching the area of the already deposited layers. This can lead to micro damages of these layers and thereby to visual damages or to short circuits. This problem is not limited to OLED devices and may as well occur in other patterned light emitting devices with layered structures.

SUMMARY OF THE INVENTION

It is an object of the invention to provide a light emitting device and a method of manufacturing a light emitting device, by means of which an improved performance of the device can be achieved.

This object is achieved by a light emitting device comprising: a) a substrate (12); b) a first active layer arranged on top of said substrate (12) and forming a first active area (10); c) a first electrode layer (20; 50) overcoating said first active area (10) to form a first diode structure adapted to emit light of a first color; d) a second active layer forming a second active area (30; 60) and overcoating said first diode structure so that it extends beyond said first diode structure; and e a second electrode layer (40; 70) over-coating said second active area (30) to form a second diode structure adapted to emit light of a second color and by a method of manufacturing a light emitting device, said method comprising: a. providing a substrate (12); b. depositing a first organic layer forming a first active area (10) on top of said substrate (12) by using a first masking process; c. depositing a first electrode layer (20; 50) overcoating said first active area (10) by using a second masking process to form a first diode structure adapted to emit light of a first color; d. depositing a second organic layer forming a second active area (30; 60) and overcoating said first diode structure so that it extends beyond said first diode structure by using a third masking process; and e. depositing a second electrode layer (40; 70) over-coating said second active area (30; 60) to form a second diode structure adapted to emit light of a second color by using a fourth masking process.

Accordingly, no mask layer touches the deposited layers (besides the anode layer and optional isolation layers). Moreover, in addition to an improved manufacturing yield the homogeneity of the light emission is improved. In contrast to the case, where only the light emitting area is coated with a conductive cathode layer, a significant larger area can be coated with the cathode layer leading to reduced sheet resistance and thereby to a better current distribution.

According to a first aspect, at least two patterned active areas may be provided, wherein the first electrode layer extends to an edge of the substrate to provide a first contact portion of the light emitting device, wherein the second electrode layer excludes at least a part of the first contact portion and extends to an edge of the light emitting device to provide a second contact portion, and wherein the first and second active areas can be addressed individually via the first and second contact portions. Thus, stacked active areas can be electrically addressed individually by their respective contact portions of the electrode layers.

According to a second aspect, the first and second electrode layers are cathode layers. Thus, light emission of the first and second active areas can be individually controlled through the first and second cathode layers. The stacked approach with extended cathode layers provides a patterned OLED structure with reduced visual damages and/or short circuits.

According to a third aspect which may be combined with the first aspect, the light emitting device may be an OLED device, wherein the first and second active layers are organic layers.

According to a fourth aspect which can be combined with any one of the first and second aspects, an area covered by the second cathode layer is (significant) larger than the second active area. Thereby, the sheet resistance can be reduced and current distribution can be improved.

According to a fifth aspect which can be combined with any one of the first to third aspects, the masking process may comprise shadow masking. Thereby, patterning with high flexibility—especially for organic materials—can be achieved.

According to a sixth aspect which can be combined with any one of the first to fifth aspects, the first electrode layer may be adapted to form a transparent interelectrode. In this case, the substrate may comprises a first anode and a second anode separated by an isolation area, wherein the first active area covers the first anode and extends to the isolation area, and wherein the second active area covers the interelectrode above the first anode and extends across the second anode. Thereby, a structured anode can be provided, which allows selective activation of the two active areas, wherein a mixture of emitted wavelengths is emitted in the overlapping area(s).

According to a seventh aspect which can be combined with the sixth aspect, the interelectrode may comprises a terminal for supplying electric power to vary its light transmission properties. Thus, color mixing can be controlled via a voltage applied to the interelectrode.

According to a eighth aspect which can be combined with the sixth or seventh aspect, the interelectrode may be adapted to provide a color filter characteristic. Thus, the output color can be influenced by the color characteristic of the color filter.

Further advantageous embodiments are defined below.

BRIEF DESCRIPTION OF THE DRAWINGS

These and other aspects of the invention will be apparent from and elucidated with reference to the embodiments described hereinafter.

In the drawings.

DETAILED DESCRIPTION OF EMBODIMENTS

Various embodiments are now described based on a stacked OLED device with at least two emitting areas and extended electrode layer(s). It is however noted that the present invention can be applied to any type of light emitting device with patterened layer-stack structure and two or more active areas. Mask deteriorations or damages are prevented by depositing a structured upper layer above a structured lower layer, wherein the upper layer is larger than the lower layer and thus covers the lower layer.

The OLED device comprises a substrate material which can be formed by a glass panel or a panel made of organic material or metal. Thus, the substrate material forms the basic structure, on which different layers are superimposed. These layers are at least an anode layer, which can be performed as an Indium-Tin-Oxide layer (ITO-layer), and which is superimposed by a plurality of different functional organic layers forming an active area, whereby the functional organic layers may only be shown as a single organic or luminescent layer to simplify matters. These functional organic layers may comprise at least a hole injection layer, a hole transport layer, emission layers (fluorescent and/or phosphorescent emitter), in which the emission of light is realised, and at least one hole blocking layer, an electron transport layer and at least one electron injection layer, whereas the different layers are usually very thin, limited to a thickness of e.g. approximately 10 nm each. The top layer is a cathode layer, which sandwiches the different functional layers between the anode layers. A power supply is connected between the anode layer and the cathode layer.

In the following, an improved manufacturing procedure for a layered OLED structure with two active areas (i.e. light emitting organic areas) according to a first embodiment of the present invention will be described with reference to FIGS. 1 to 5. Thereby, for OLED devices consisting of two or more active areas a more robust manufacturing method can be realized. The OLED device of the first embodiment comprises at least two individually addressable emitting areas with extended cathode layers providing electrical contact portions at the rim or edge of the OLED device, so that two complete OLEDs are stacked above each other. To prevent any shortcuts between anode and cathode layers, the anode layer may be a structured anode layer which is contacted from its backside or via a conducting path covered by an isolation layer on those areas where no functional organic layer or area is arranged. As another option, the anode layer may be a non-structured anode layer which is covered by an isolation layer in those areas not covered by the functional organic layer or area. The non-structured anode layer may be contacted from its backside or at an edge portion of the OLED device where no isolating layer is present and where the anode layer cannot get into contact with any upper cathode layer.

Figure 1:
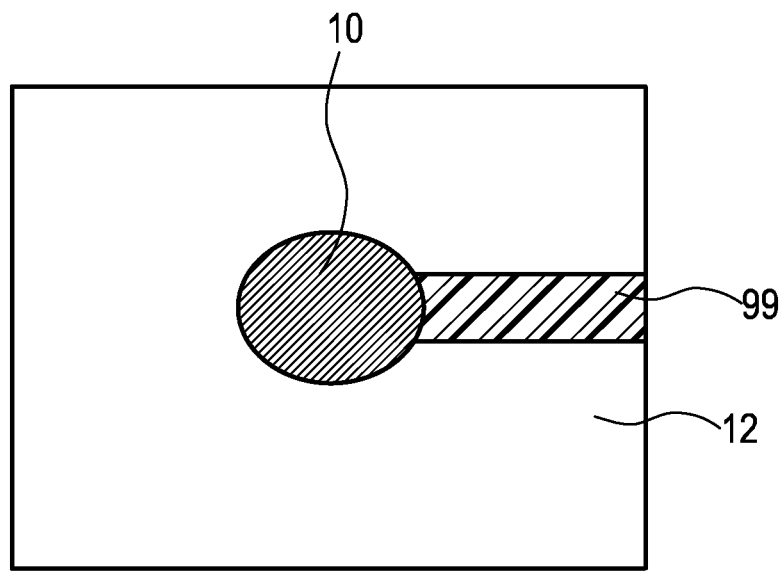
FIG. 1 shows a schematic top view of a first organic area coated onto a substrate according to a first embodiment of the present invention.

FIG. 1 shows a top view of the OLED structure after a first step where a first organic area 10 is coated through a shadow mask onto a substrate 12 so that it partially covers a structured or non-structured anode layer (not shown) of the substrate 12. Thus, in the first step the first organic area 10 of the active pattern of the OLED device is deposited through a shadow mask onto the substrate 12. This may be achieved by a small-scale technique called shadow-mask evaporation where light-emitting organic molecules that make up the pixels are deposited. An alternative deposition technique may be ink-jet printing or other techniques that may combine features of shadow-mask printing and ink-jet printing to achieve high-quality OLED pixels over a large area. Furthermore, an electrically insulating area 99 is deposited to provide isolation between a subsequently deposited cathode layer 20 and an anode layer of the substrate 12. The insulating area 99 may be omitted if the first organic area 10 somewhere reaches to the edge of the OLED device, so that direct contact between the anode layer and the cathode layer 20 can be prevented.

Figure 2:
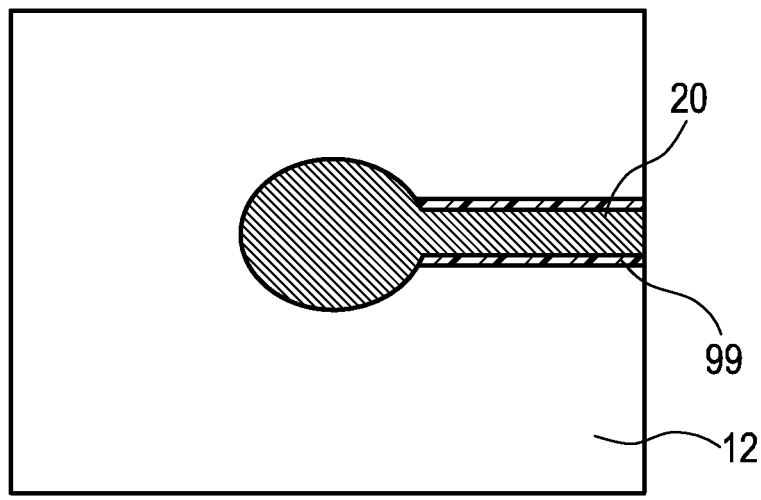
FIG. 2 shows a schematic top view of an extended first cathode layer coated onto the substrate and the first organic area, according to the first embodiment.

FIG. 2 shows a top view of the OLED structure after a second step where a first cathode layer 20 which extends to a contact portion or ledge at the rim of the OLED device is coated or deposited through a shadow mask onto the substrate 12 so that it covers the first organic area 10 and the insulating area 99. Hence, after this step the cathode layer 20 overcoats the first organic area 10 and extends to the contact points at the rim of the OLED device, so that a first individually addressable active area is formed. The cathode layer should be somewhat smaller than the insulating area 99 to reduce the risk of any shortcuts to the anode layer.

Figure 3:
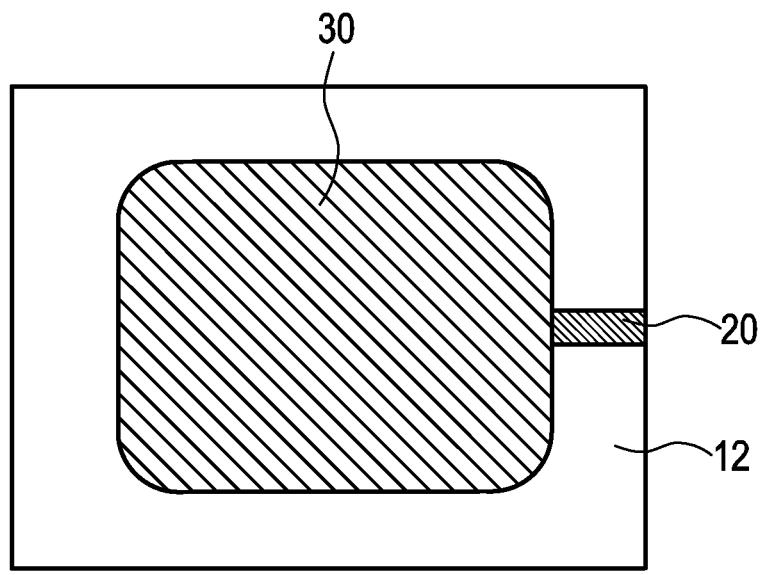
FIG. 3 shows a schematic top view of a second organic area coated onto the substrate on top of the first OLED layer stack, according to the first embodiment.

FIG. 3 shows a top view of the OLED structure after a third step where a second organic area 30 is coated through a shadow mask onto the substrate 12, on top of the first coated structure of the first active area. The second organic area 30 is deposited and the mask is made in such a way that the first OLED stack of the first active area is overcoated with the organic material of the second organic area 30 of the OLED structure.

Figure 4:
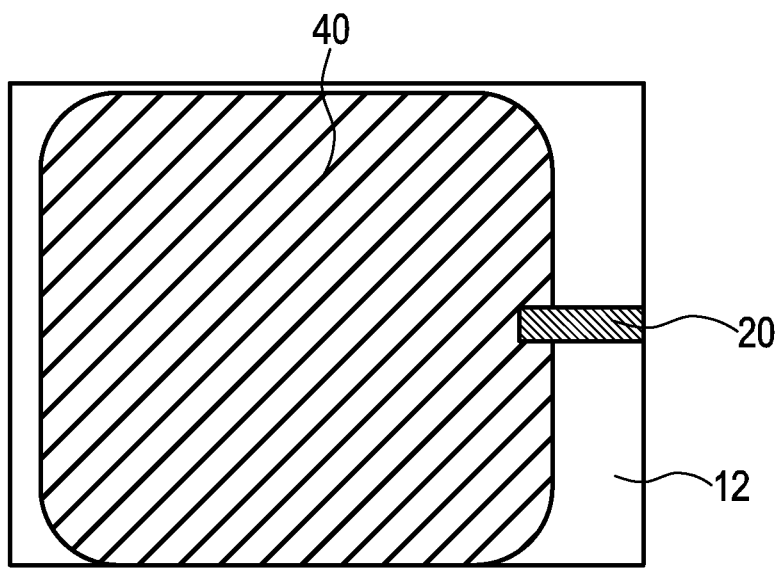
FIG. 4 shows a schematic top view of an extended second cathode layer of a second OLED stack coated on the substrate on top of the first OLED stack, according to the first embodiment.

FIG. 4 shows a top view of the OLED structure after a fourth step where a second cathode layer 40 of a second OLED stack of the second active area is coated across the first OLED stack. The second cathode layer 40 of the second diode is coated or deposited through a shadow mask such that it overcoats the whole second organic area 30, excluding only parts of the cathode contact ledge or portion of the first OLED stack of the first active area. Moreover, the second contact layer 40 is enlarged to extend to the rim if the OLED structure in order to be able to electrically contact this layer by a corresponding contact portion at the rim of the OLED structure or device.

Figure 5:
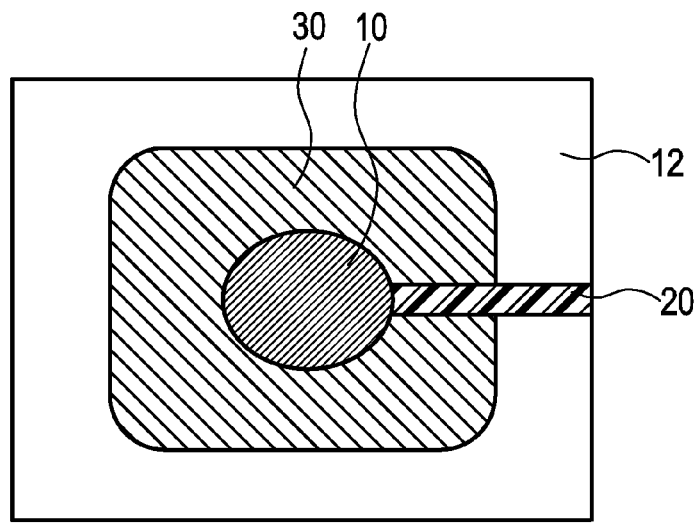
FIG. 5 shows a schematic top view of light emission of the first organic area and the second organic area of the first embodiment.
Figure 13:
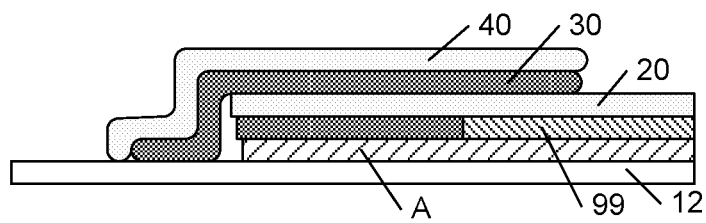
FIG. 13 shows a schematic cross-section view of light emission of the first organic area and the second organic area of the first embodiment.

FIG. 5 shows a top view, and FIG. 13 shows a cross-section view of the light emission achieved by the top-emitting OLED structure manufactured by the above four steps. The first organic (OLED) area 10 may emit e.g. green light and the surrounding second organic (OLED) area 30 may emit blue light. The first cathode contact layer 20 of the first active area does not emit light and is thus shown in black color. The two organic areas 10, 30 can now be electrically addressed individually to control emission from the respective active areas.

Thus, at least in some areas, two OLED stacks or structures can be deposited one above the other. In the area where the light emission of the upper active area cannot exit, the upper organic layer or area serves to isolate the two cathode contact layers from each other so that the size of the upper cathode can be increased to provide an increased conductivity.

Now, an improved manufacturing procedure for a layered OLED structure with two active areas (i.e. light emitting organic areas) according to a second embodiment of the present invention will be described with reference to FIGS. 6 to 11. Thereby, for OLED devices consisting of two active areas, a more robust manufacturing method can be realized. The OLED device of the second embodiment comprises two individually emitting areas with interelectrode and single upper cathode layer.

Figure 6:
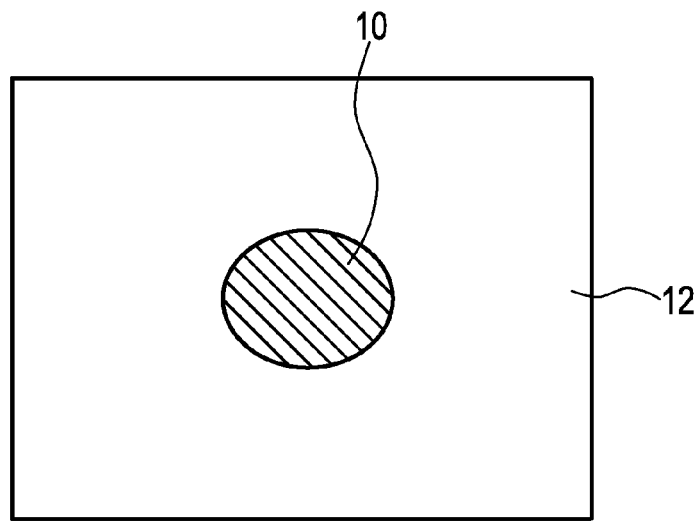
FIG. 6 shows a schematic top view of a first organic area coated onto a substrate according to a second embodiment of the present invention.

FIG. 6 shows a top view of the OLED structure after a first step where a first organic layer or area 10 is coated or deposited through a shadow mask onto a substrate 12, similar to the first embodiment. This may again be achieved by a small-scale technique called shadow-mask evaporation or an alternative deposition technique such as ink-jet printing or other techniques that may combine features of shadow-mask printing and ink-jet printing to achieve high-quality OLED pixels over a large area. The first organic area 10 is suitable to emit light of a certain colour, for example blue, if a cathode would be present and a voltage would be applied between anode and cathode.

Figure 7:
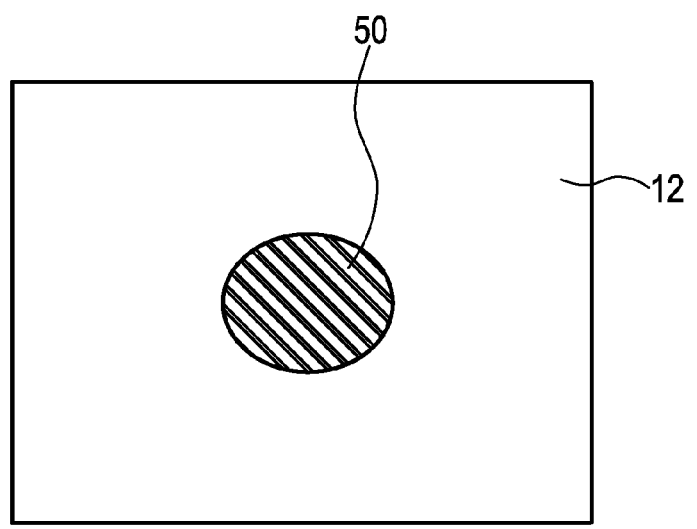
FIG. 7 shows a schematic top view of a transparent interelectrode deposited onto the substrate and the first organic area, according to the second embodiment.

FIG. 7 shows a top view of the OLED structure after a second step where a transparent interelectrode 50 is deposited or coated through a shadow mask on top of the first organic area 10. Hence, after this step the interelectrode 50 overcoates the first organic area 10.

Figure 8:
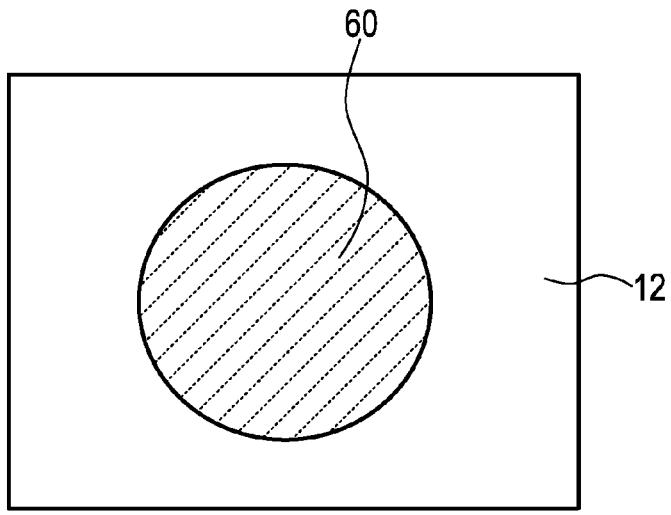
FIG. 8 shows a schematic top view of a second organic area coated onto the substrate on top of the first OLED layer stack, according to the second embodiment.

FIG. 8 shows a top view of the OLED structure after a third step where a second organic layer or area 60 is coated through a shadow mask onto the substrate 12, on top of the interelectrode 50. The second organic area 60 is deposited and the mask is made in such a way that the first OLED stack of the first active area 10 is overcoated with the organic material of the second organic area 60 of the OLED structure. The second organic area 60 is thus coated onto the interelectrode 50 and at least partially over or onto an anode layer (not shown in FIG. 3) of the substrate 12, being capable to emit light of a certain colour, for example yellow. The second organic area 60 is therefore extending over the first organic area 10.

Figure 9:
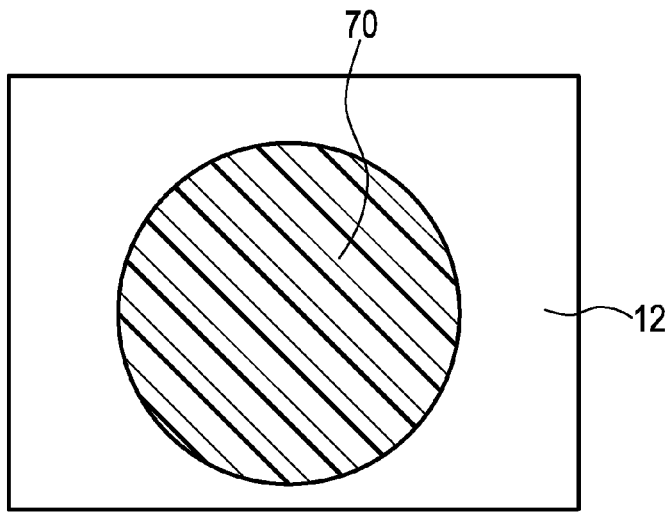
FIG. 9 shows a schematic top view of a cathode layer of a second OLED stack coated on the substrate on top of the first OLED stack, according to the second embodiment.

FIG. 9 shows a top view of the OLED structure after a fourth step where a cathode layer 70 of a second OLED stack of the second active area is coated across the first OLED stack. The cathode layer 70 of the second diode is coated or deposited through a shadow mask such that it extends the organic areas 10 and 60.

Figure 10:
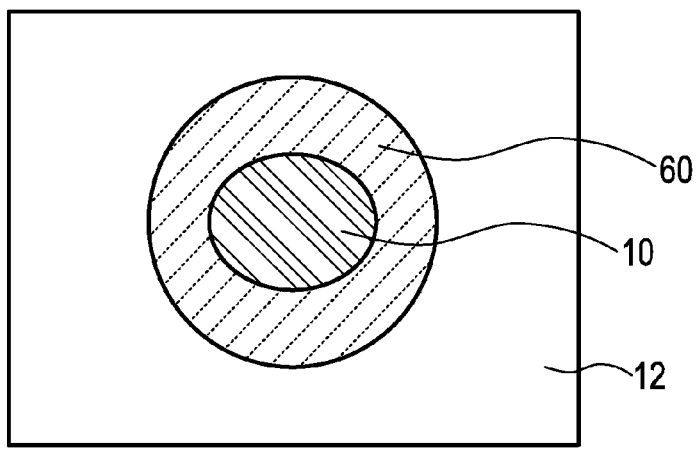
FIG. 10 shows a schematic top view of light emission of the first organic area and the second organic area of the second embodiment.
Figure 12:
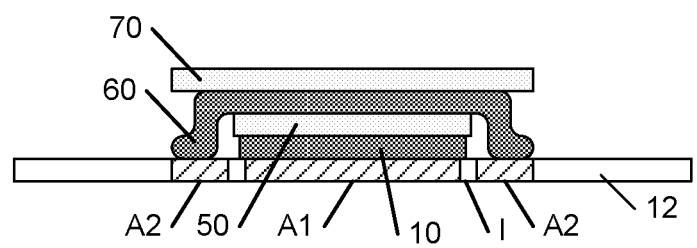
FIG. 12 shows a schematic cross-section view of light emission of the first organic area and the second organic area of the second embodiment.

FIG. 10 shows a top view, and FIG. 12 shows a cross-section view of the light emission achieved by the top-emitting OLED structure manufactured by the above four steps. If a voltage is applied between the anode A of the substrate 12 and the cathode layer 70, a current is drawn through the organic material. The first organic stack will emit light of a certain wavelength (e.g blue) and the second organic material will emit light of another wavelength (e.g. yellow). In the area where both layers overlap each other a mixture of the wavelengths of the two individual organic areas 10, 60 is emitted (e.g., blue+yellow=white).

In the second embodiment, contrary to the first embodiment, a structured anode is required since a cathode layer is used for both emitting areas and stacks of different thicknesses are driven by different voltages.

Figure 11:
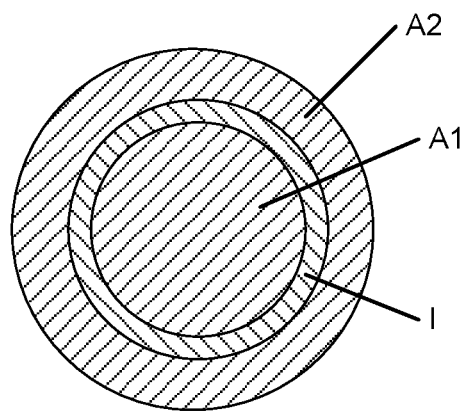
FIG. 11 shows a schematic top view of a structured anode which can be used in the second embodiment.

FIG. 11 shows a schematic top view of a structured anode which can be used in the second embodiment. First and second anode sections or anodes A1, A2 are provided in or on the substrate and are isolated by an isolating area I, so that the first organic area 10 is arranged above the first anode A1 and extends to the isolation area I between the first anode A1 and the second anode A2. The first and second anodes A1 and A2 may be contacted via back contacting or by contacting strips covered by a structured isolation layer. The transparent interelectrode (layer) 50 which covers the first organic area 10 also extends to the isolation area I. The second organic area 60 covers the interelectrode 50 above the first anode A1 and extends across the second anode A2. Thereby, the first anode A1 controls the lower OLED stack with the first organic area 10 and the second anode A2 controls the upper OLED stack with the second organic area 60.

To summarize, a light emitting device with at two active areas and a more robust method of manufacturing such a device have been described, wherein a first electrode layer is deposited through a mask overcoating an active material. A second active material is deposited through another mask in such a way that an area which covers and extends beyond the first electrode layer is overcoated with the organic material. Then, a second electrode layer is coated through a mask such that it overcoats the whole second active material.

While the invention has been illustrated and described in detail in the drawings and foregoing description, such illustration and description are to be considered illustrative or exemplary and not restrictive. The invention is not limited to the disclosed embodiment and can be used for various types of stacked light emitting device structures with three or even more stacked organic layers with intermediate cathode layers and resulting "overcoated pixels". The concept could thus be generalized to three or more active areas. The size of the active areas could be adapted to the efficiency of the active materials (e.g. organic or other light emitting materials) and the intended application (white light, colored light, display). Instead of the cathode layers, other types of electrode layers (e.g. anode layers) may be used, e.g., the locations of anodes and cathodes could be exchanged e.g. by inverting the sequence of deposited layers. Moreover, the intermediate electrode could be made transparent and controllable. Furthermore, Other variations to the disclosed embodiment can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. A light emitting device comprising:
a substrate comprising a first anode and a second anode separated by an isolation area;
a first active layer arranged on top of the substrate, the first active layer comprising a first active area, wherein the first active area covers the first anode and extends beyond the first anode to cover at least a portion of the isolation area;
a first electrode layer over-coating the first active area to form a first diode structure, the first diode structure adapted to emit light of a first color, wherein the first electrode layer is adapted to form a transparent interelectrode, and wherein the first active layer that extends over the portion of the isolation area serves to insulate the first electrode layer from the first anode;
a second active layer over-coating the first diode structure so that it extends beyond the first diode structure, the second active layer comprising a second active area, wherein the second active area covers the interelectrode above the first anode and extends across the second anode; and
a second electrode layer over-coating the second active area to form a second diode structure, wherein the second diode structure is adapted to emit light of a second color that is different from the first color,
wherein each of the first and second diode structures are independently controllable via the first and second anodes to selectively emit one of: the second color, and a combination of the first and second colors.

2. The device according to claim 1,
wherein the device comprises at least the two patterned active areas,
wherein the first electrode layer extends to an edge of the substrate, the first electrode layer comprising a first contact portion of the light emitting device,
wherein the second electrode layer excludes at least a part of the first contact portion and extends to an edge of the light emitting device, the second electrode layer comprising a second contact portion, and
wherein the first and second active areas are addressed individually via the first and second contact portions.

3. The device according to claim 2, wherein the first and second electrode layers are cathode layers.

4. The device according to claim 1, wherein the light emitting device is an organic light emitting diode device, wherein the first and second active layers are one of organic layers or organic layer stacks.

5. The device according to claim 1, wherein an area covered by the second cathode layer is larger than the second active area.

6. The device according to claim 1, wherein the interelectrode comprises a terminal for supplying electric power.

7. The device according to claim 1, wherein the interelectrode is arranged to provide a color filter characteristic.

8. The device according to claim 6, wherein the interelectrode is arranged to vary its light transmission properties when supplied with electricity.

* * * * *